United States Patent
Cheng et al.

(10) Patent No.: US 11,610,808 B2
(45) Date of Patent: Mar. 21, 2023

(54) SEMICONDUCTOR WAFER WITH LOW DEFECT COUNT AND METHOD FOR MANUFACTURING THEREOF

(71) Applicant: TAIWAN SEMICONDUCTOR MANUFACTURING COMPANY LTD., Hsinchu (TW)

(72) Inventors: Yu-Hung Cheng, Tainan (TW); Cheng-Ta Wu, Chiayi County (TW); Yeur-Luen Tu, Taichung (TW); Ching-Pei Su, Hsinchu (TW); Tung-I Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 165 days.

(21) Appl. No.: 16/548,862

(22) Filed: Aug. 23, 2019

(65) Prior Publication Data
US 2021/0057270 A1    Feb. 25, 2021

(51) Int. Cl.
*H01L 21/762*   (2006.01)
*H01L 29/34*    (2006.01)
(Continued)

(52) U.S. Cl.
CPC .. *H01L 21/76256* (2013.01); *H01L 21/02019* (2013.01); *H01L 21/30604* (2013.01); *H01L 21/461* (2013.01); *H01L 21/465* (2013.01); *H01L 29/34* (2013.01); *H01L 29/167* (2013.01); *H01L 29/36* (2013.01)

(58) Field of Classification Search
CPC ........ H01L 21/02532; H01L 21/76254; H01L 21/0245; H01L 21/76256; H01L 21/30604; H01L 27/1203; H01L 21/02381; H01L 21/76251; H01L 29/34; H01L 29/167;
(Continued)

(56) References Cited

U.S. PATENT DOCUMENTS 9,735,062 B1 *  8/2017  Doris ................ H01L 21/02642
10,304,723 B1   5/2019  Cheng et al.
(Continued)

FOREIGN PATENT DOCUMENTS

JP      2009016865 A  *  1/2009  ....... H01L 21/02381

OTHER PUBLICATIONS

JP 2009016865A Machine Eng Translation (Year: 2009).*

*Primary Examiner* — David Chen
(74) *Attorney, Agent, or Firm* — WPAT Law; Anthony King (57) ABSTRACT

A semiconductor wafer and method for manufacturing thereof are provided. The semiconductor wafer includes a handling substrate and a silicon layer over the handling substrate and having a {111} facet at an edge of a top surface of the silicon layer. The a defect count on the top surface of the silicon layer is less than about 15 each semiconductor wafer. The method includes the following operations: a semiconductor-on-insulator (SOI) substrate is provided, wherein the SOI substrate has a handling substrate, a silicon layer over the handling substrate, and a silicon germanium layer over the handling substrate, and a silicon germanium (Continued)

layer over the silicon layer; and the silicon germanium layer is etched at a first temperature with hydrochloric acid to expose a first surface of the silicon layer.

19 Claims, 8 Drawing Sheets

(51) Int. Cl.
  *H01L 21/306* (2006.01)
  *H01L 21/02* (2006.01)
  *H01L 21/461* (2006.01)
  *H01L 21/465* (2006.01)
  *H01L 29/167* (2006.01)
  *H01L 29/36* (2006.01)

(58) Field of Classification Search
  CPC . H01L 29/36; H01L 21/02019; H01L 21/461; H01L 21/465
  USPC .............. 438/455, 458, 459, 479, 509, 692; 257/347, 616, E21.12, E21.129, E21.324, 257/E21.561, E21.567, E21.568, E27.112
  See application file for complete search history.

(56) References Cited

U.S. PATENT DOCUMENTS

| | | | |
|---|---|---|---|
| 2005/0215017 A1* | 9/2005 | Chen | H01L 21/84 438/301 |
| 2006/0289905 A1* | 12/2006 | Kito | H01L 29/7851 257/288 |
| 2007/0026650 A1* | 2/2007 | Hebras | H01L 21/26506 438/514 |
| 2007/0166929 A1* | 7/2007 | Matsumoto | H01L 21/7624 438/285 |
| 2007/0190787 A1* | 8/2007 | Loubet | H01L 21/306 438/689 |
| 2009/0130826 A1* | 5/2009 | Kim | H01L 21/0245 438/478 |
| 2013/0241028 A1* | 9/2013 | Chen | H01L 29/0649 257/506 |
| 2015/0255501 A1* | 9/2015 | Murano | H01L 27/14612 257/292 |
| 2021/0225695 A1* | 7/2021 | Schwarzenbach | H01L 21/76275 |

* cited by examiner

SEMICONDUCTOR WAFER WITH LOW DEFECT COUNT AND METHOD FOR MANUFACTURING THEREOF

FIELD

The present disclosure is related to a semiconductor wafer and a method for manufacturing thereof and, more particularly, to a method selectively etching a silicon germanium layer of a SOI substrate with hydrochloric acid, and thinning down the SOI substrate accordingly.

BACKGROUND

Conventional silicon-on-insulator (SOI) CMOS devices typically have a thin layer of silicon, also known as the active layer, on an insulator layer such as a buried oxide (BOX) layer. Active devices, such as MOS transistors (MOSFETs), are formed in active regions within the active layer. The size and placement of the active regions are defined by isolation regions, such as shallow trench isolation (STI) regions. Active devices in the active regions are isolated from the substrate by the BOX layer.

Devices formed on SOI substrates exhibit many improved performance characteristics over their bulk substrate counterparts. SOI substrates are particularly useful in reducing problems relating to reverse body effects, device latch-up, soft-error rates, and junction capacitance. SOI technology therefore enables higher speed performance, higher packing density, and reduced power consumption.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

SOI wafer has a variety of application including MEMS, power device, pressure sensors and CMOS integrated circuit fabrication. SOI wafer provide a potential solution for high speed and low power consumption device and has been widely used for high voltage and RF components. Generally, SOI wafer is a sandwich structure including a device layer or an active layer on top, a buried oxide layer as an insulating layer in the middle, and a handle substrate in the bottom.

There are several techniques currently available for the fabrication of SOI wafers. One technique is known as "separation by implantation of oxygen" (SIMOX), where oxygen is implanted below the silicon surface and the substrate is annealed to provide a buried silicon oxide layer with a silicon overlayer. The implantation time can be intensive and cost prohibitive. Moreover, the SOI wafer may be exposed to high surface damage and contamination.

Another technique is known as "bond and etch back" SOI (BESOI), where an oxidized substrate is firstly diffusion-bonded to an unoxidized substrate. That is, the substrates are joined together with the specular glossy faces facing each other and with the oxide layer being between the two substrates. The joined substrates are heated to an appropriate temperature to increase the bonding strength. One of the substrates constitutes a handle substrate and the other constitutes a device substrate. An exposed surface of the device substrate is then grinded, polished, and etched until the device wafer becomes a thin layer, i.e., a desired device layer. There is no implantation in BESOI approach so that it may minimize the implant damage done to the substrate surface inherent in the SIMOX approach.

Still another technique is known as the hydrogen implantation and separation approach, also be called as "Smart Cut", where the hydrogen is implanted into silicon with a thermally grown oxide to form embrittlement of the silicon substrate underneath the oxide layer. The implanted substrate may then be bonded with another silicon substrate with an oxide overlayer. The bonded substrate may be cut across the substrates at the peak location of the hydrogen implant by appropriate annealing.

The method for manufacturing semiconductor wafer in the present disclosure is under the BESOI approach. As previously mentioned, an oxidized substrate and an unoxidized substrate are both provided in such approach, wherein the oxidized substrate is used as a handle substrate and the unoxidized substrate is used as a device substrate.

Figure 1:
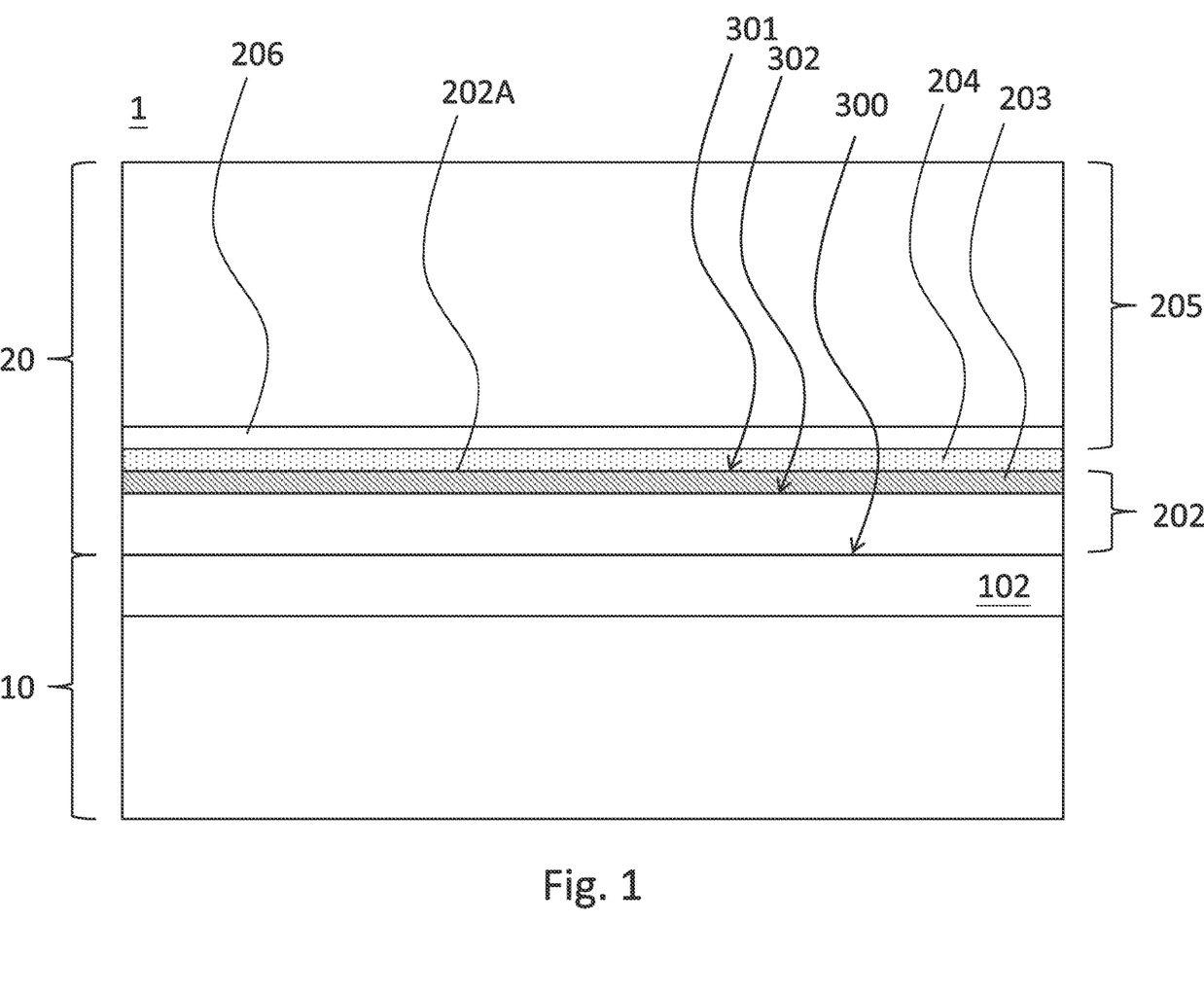
FIG. 1 illustrates a cross-sectional view of a SOI substrate according to some embodiments of the present disclosure.

Referring to FIG. 1, a semiconductor-on-insulator (SOI) substrate 1 is provided. The semiconductor stack 1 includes a handling substrate 10 and a device substrate 20. The device substrate 20 is bonded to the handling substrate 10 at a bonding interface 300. The handling substrate 10 is for supporting the structure thereon. In some embodiments, the material of the handling substrate 10 is silicon. In some embodiments, the handling substrate 10 includes an insulating layer at a top surface of the handling substrate 10. In some embodiments, the insulating layer 102 is a buried oxide layer.

The device substrate 20 includes a plurality of semiconductor layers. In some embodiments, the device substrate 20 includes a silicon layer 202, a silicon germanium layer 204, and a p-silicon layer 206 stacked over the bonding interface 300. More precisely, the silicon layer 202 is in contact with a top surface of the insulating layer 102, the silicon germanium layer 204 is formed over the silicon layer 202 by an epitaxial growth process such as molecular beam epitaxy, chemical vapor deposition (CVD), or low pressure CVD (LPCVD). The p-silicon layer 206 is formed over the silicon germanium layer 204. In some embodiments, the silicon layer 202 includes a germanium diffusion layer 203 at a first surface 202A and in contact with the silicon germanium layer 204. The germanium diffusion layer 203 may include germanium and some other dopants diffused from the silicon germanium layer 204, for example, the element boron (B).

Figure 2:
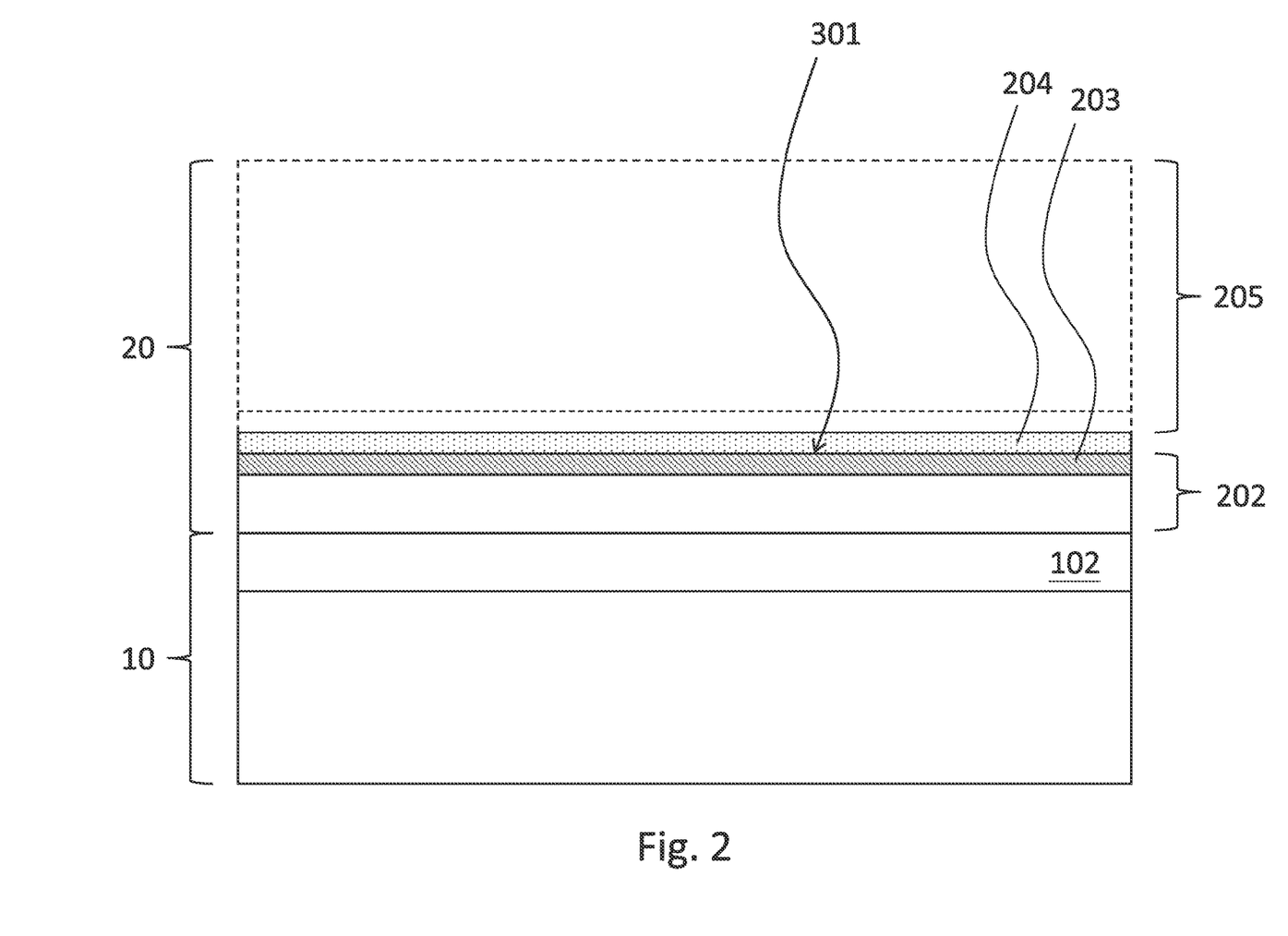
FIG. 2 illustrates a cross-sectional view of a SOI substrate in accordance with some embodiments of the present disclosure.

Referring to FIG. 2, during the operations of manufacturing the SOI wafer, the device substrate 20 may be firstly thinned down and thus a portion 205 of the device substrate 20 may be removed accordingly. In some embodiments, the removed portion 205 may include the p-silicon layer 206 and the substrate materials there above, and hence a top surface 204A of the silicon germanium layer 204 is exposed.

There are various operations for removing the portion 205. In some embodiments, the portion 205 may be removed through wet etching that using a wet etchant comprising tetramethylammonium hydroxide (TMAH). In alternative embodiments, the wet etchants may include HNA, potassium hydroxide (KOH), and/or buffered oxide etch (BOE). HNA is an acidic mixture includes hydrofluoric acid (HF), nitric acid ($HNO_3$), and acetic acid ($CH_3COOH$) in the ratio of 3:5:3 parts by weight. In some embodiments, the portion 205 may be thinned down by wet etching and followed by a chemical mechanical polishing/planarization (CMP) process to be fully removed. In some embodiments, the removal of the portion 205 may include a dry etch process.

Figure 3:
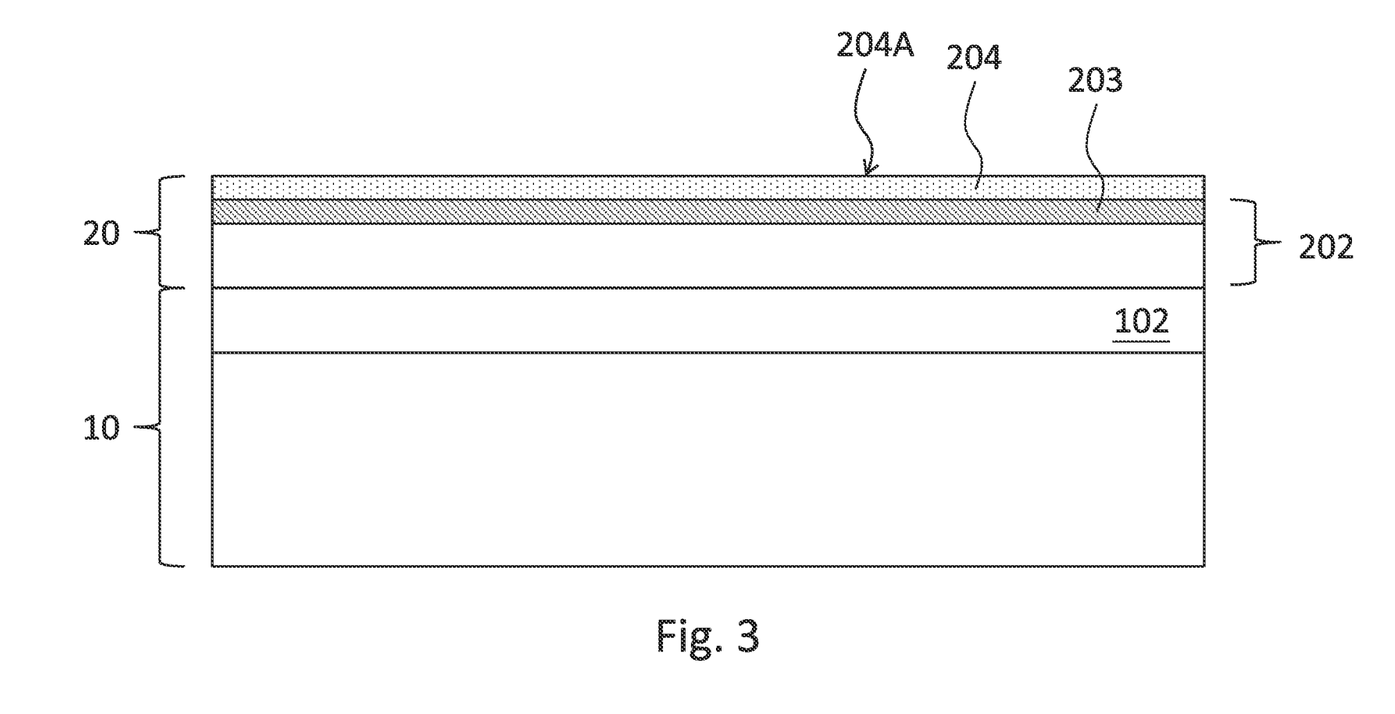
FIG. 3 illustrates a cross-sectional view of a SOI substrate in accordance with some embodiments of the present disclosure.

After the portion 205 of the device substrate 20 is removed, as shown in FIG. 3, the top surface 204A of the silicon germanium layer 204 is exposed. Then, in some embodiments, the silicon germanium layer 204 may be baked in order to remove a plurality of interface contaminants such as native oxides distributed at the top surface 204A. In some embodiments, the native oxides include $SiO_2$. In some embodiments, diluted hydrogen fluoride (HF) solution is also used in removing the interface contaminants. In some embodiments, the silicon germanium layer 204 is baked at a second temperature in a range of from about 700 Celsius degrees to about 800 Celsius degrees. In some embodiments, the second temperature is higher than 750 Celsius degrees. In some embodiments, a baking time of the baking operation is in a range of from about 1 minute to about 2 minutes. In some embodiments, the baking operation is implemented with hydrogen gas and at a pressure less than about 100 torr.

Figure 4:
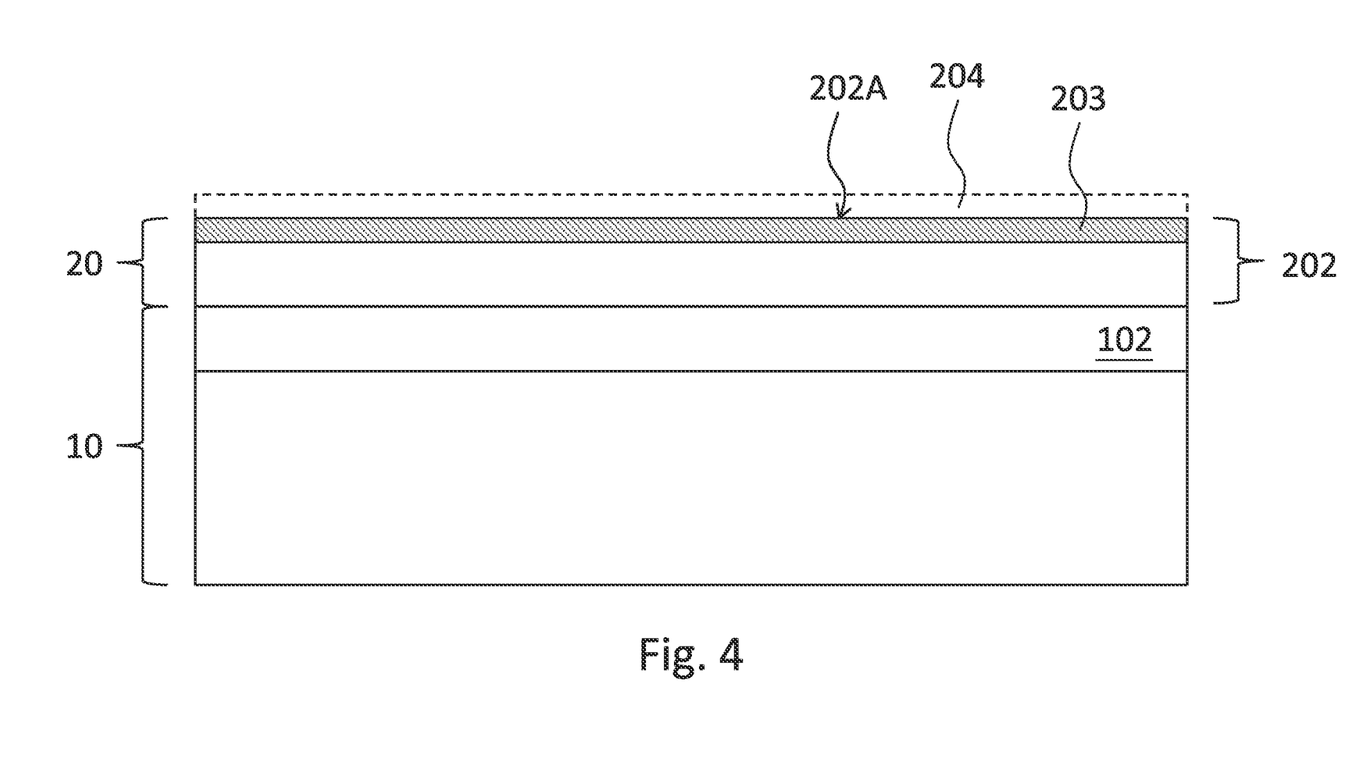
FIG. 4 illustrates a cross-sectional view of a SOI substrate in accordance with some embodiments of the present disclosure.

After the silicon germanium layer 204 is baked in some embodiments or without the baking operation in some other embodiments, referring to FIG. 4, the silicon germanium layer 204 is etched with hydrochloric acid (HCl) in a chemical vapor etching (CVE) process at a first temperature to expose the first surface 202A of the silicon layer 202. In some embodiments, the first temperature is in a range of from about 650 Celsius degrees to about 700 Celsius degrees. In some embodiments, the second temperature is higher than the first temperature. In other words, the temperature in the baking operation is higher than that in the hydrochloric acid etching operation.

In some embodiments, the thickness of the silicon germanium layer 204 is less than about 15 nm. Such thickness of the silicon germanium layer 204 is associated with the thermal shock resistance thereof during the baking operation. That is, a thicker silicon germanium layer 204 may crack under the first temperature as previous mentioned in the baking operation due to a weaker thermal shock resistance. Accordingly, a thinner silicon germanium layer 204 may maintain the quality of the silicon layer 202 there below in a stable status.

In some embodiments, the silicon germanium layer 204 has a boron concentration greater than about $1E20/cm^3$. The boron dopants in the silicon germanium layer 204 may enhance the etch-stop ability of the silicon germanium layer 204 to the etchants such as TMAH, so that in the duration of removing the portion 205 of the device substrate 20 as shown in FIG. 2, the structures under the silicon germanium layer 204 may be protected and therefore no etching pits may be formed in the silicon layer 202 or the insulating layer 102. For instance, in the case of the silicon germanium layer 204 with thickness less than about 15 nm and has a boron concentration lower than about $1E20/cm^3$, the etchants for removing the portion 205 may etch through the silicon germanium layer 204 and damage the silicon layer 202 or the insulating layer 102 afterwards.

In some embodiments, the silicon germanium layer 204 has a germanium concentration in a range of from about 20% to about 30%. The germanium concentration in the silicon germanium layer 204 is related to the etch selectivity of silicon germanium to silicon. In order to achieve a specific selective etch, several approaches such as thermal etching, plasma-based dry etching and wet chemical etching may be implemented in the etching operation. In the approach of plasma dry etching, the material is exposed to a bombardment of ions such as fluorocarbons from $CF_4$ that dislodge portions of the material from the exposed surface. In the approach of wet chemical etching, the material is positioned in a wet bench and an etching solution such as HNA is used. In contrast, as aforementioned, the silicon germanium layer 204 in the present disclosure is etched with HCl, which belongs to the approach of thermal etching. More precisely, in the approach of thermal etching, the etch operation is conducted in an epitaxy tool with HCl gas or HCl/H$_2$ gas mixture inside and with a high temperature typically at about 650 Celsius degrees.

Moreover, not only the germanium concentration in the silicon germanium layer, but also the pressure and temperature conditions (i.e., the first temperature as foregoing described) may influence the HCl selective etching ratio obviously due to the difference of chemical activity between the silicon germanium and silicon materials. In some embodiment, the etching pressure during the HCl selective etching operation is less than about 100 torr. In some embodiments, such etching pressure is less than about 10 torr. In some embodiments, such etching pressure substantially equal to the etching pressure in the baking operation. Under the pressure and the temperature conditions in the present disclosure, the etch selectivity of silicon germanium to silicon could be increased to more than about 100×. In some embodiments, the etch selectivity of silicon germanium to silicon could be about 150×, while the etching temperature is at about 700 Celsius degrees, the etching pressure is less than about 2.5 torr, and the germanium concentration in the silicon germanium layer is about 22%. In some embodiments, the etch selectivity of silicon germanium to silicon could be further increased to about 300×, while the etching temperature is at about 700 Celsius degrees, the etching pressure is less than about 2.5 torr, and the germanium concentration in the silicon germanium layer is about 28%.

By using HCl as etchant at the first temperature in removing the silicon germanium layer 204, the first surface 202A of the silicon layer 202 may thus be exposed with good surface roughness. By using atomic force microscopy (AFM) to measure the root mean square (RMS) roughness of the silicon layer 202, the RMS of the silicon layer 202 may be about 1.3 Å only. Meanwhile, by using optical scan method (e.g., KLA) to detect silicon layer defects after the etching operation, the defect count of the silicon layer 202 may be performed as about 22 each semiconductor wafer (herein after "ea"). Such semiconductor wafers can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch").

In contrast, in the case of using HNA, TMAH, or the like as etchants in removing the silicon germanium layer, the defect count of the exposed silicon layer may at a level over 1000 ea. Similarly, in the case of using CMP in removing the silicon germanium layer, the defect count of the exposed silicon layer may at a range of about 20 to 50 ea, which is not superior to the present disclosure in reducing the defects of the silicon layer. Moreover, it spends less than 30 minutes in removing the 15-nm-thickness silicon germanium layer in some embodiments of the present disclosure, which is quicker than the process that using CMP.

Figure 5:
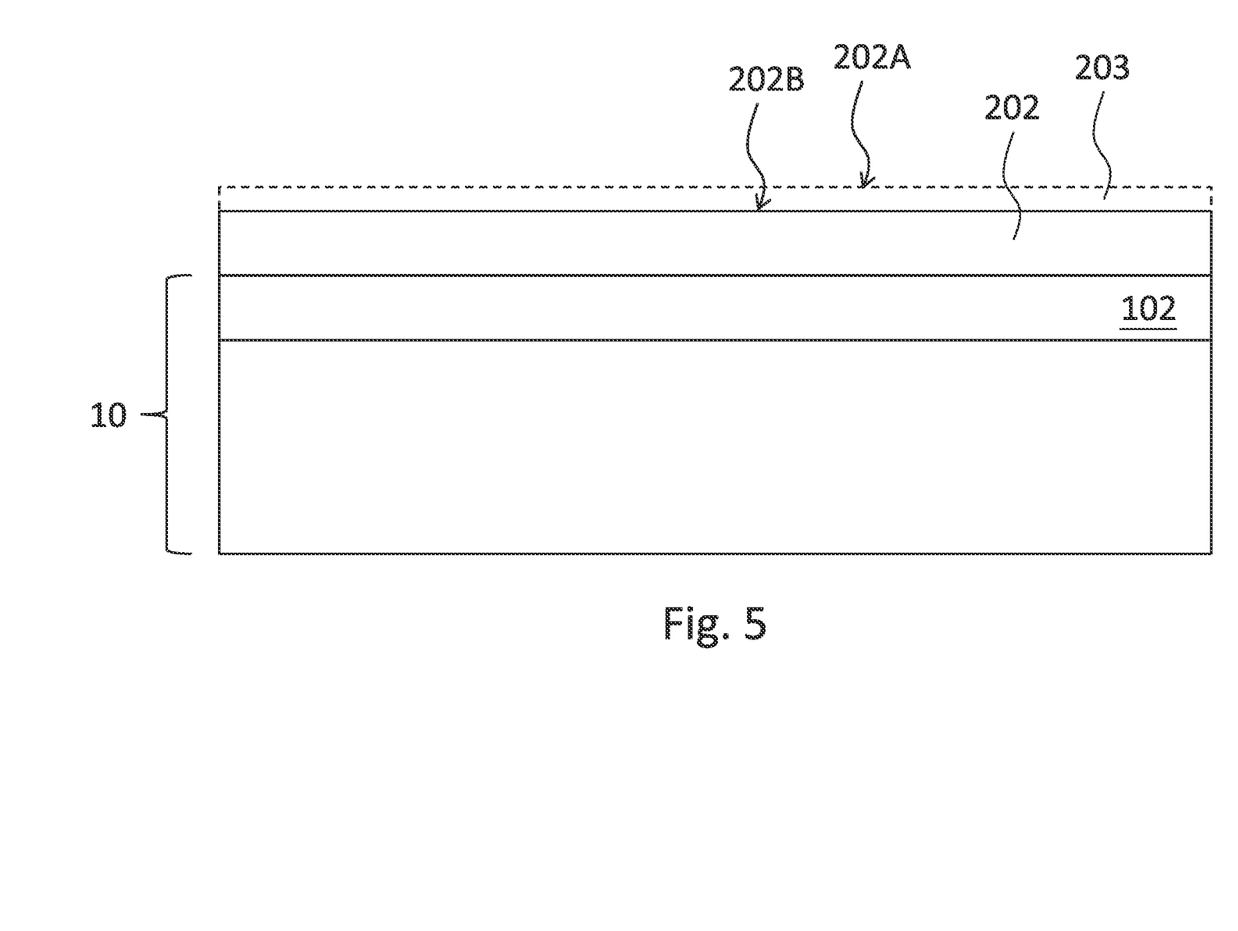
FIG. 5 illustrates a cross-sectional view of a SOI substrate in accordance with some embodiments of the present disclosure.

In some embodiments, not only the silicon germanium layer 204 is removed by HCl etching operation at the first temperature, but also the germanium diffusion layer 203 therebelow is removed. Referring to FIG. 5, the germanium diffusion layer 203 is removed and hence a second surface 202B of the silicon layer 202 is exposed. In some embodiments, the thickness of the germanium diffusion layer 203 is in a range of from about 15 nm to about 20 nm, and the thickness of the silicon layer 202 is about 135 nm, thereby after the HCl etching operation at the first temperature, the thickness of the silicon layer 202 may be decreased to a range of from about 115 nm to about 120 nm.

In some embodiments, the silicon layer 202 may be baked at a fourth temperature after etching the germanium diffusion layer 203. In some embodiments, the fourth temperature is in a range of from about 850 Celsius degrees to about 1050 Celsius degrees. In some embodiments, the baking operation is operated with hydrogen gas and at a pressure less than about 100 torr. The baking operation after the germanium diffusion layer 203 removed may not only eliminate the contamination at the second surface 202B, but also the atoms thereof may be reconstructed and so that the second surface 202B may be smoothen.

Depending on different types of application, the thickness of the silicon layer may be various. For example, a fully depleted (FD) SOI requires SOI wafers with very thin top silicon layer and a very thin insulating layer therebelow. In other words, the thickness of the top silicon layer defining the device channel must be tightly controlled to allow the fully depleted operation of transistors.

Figure 6:
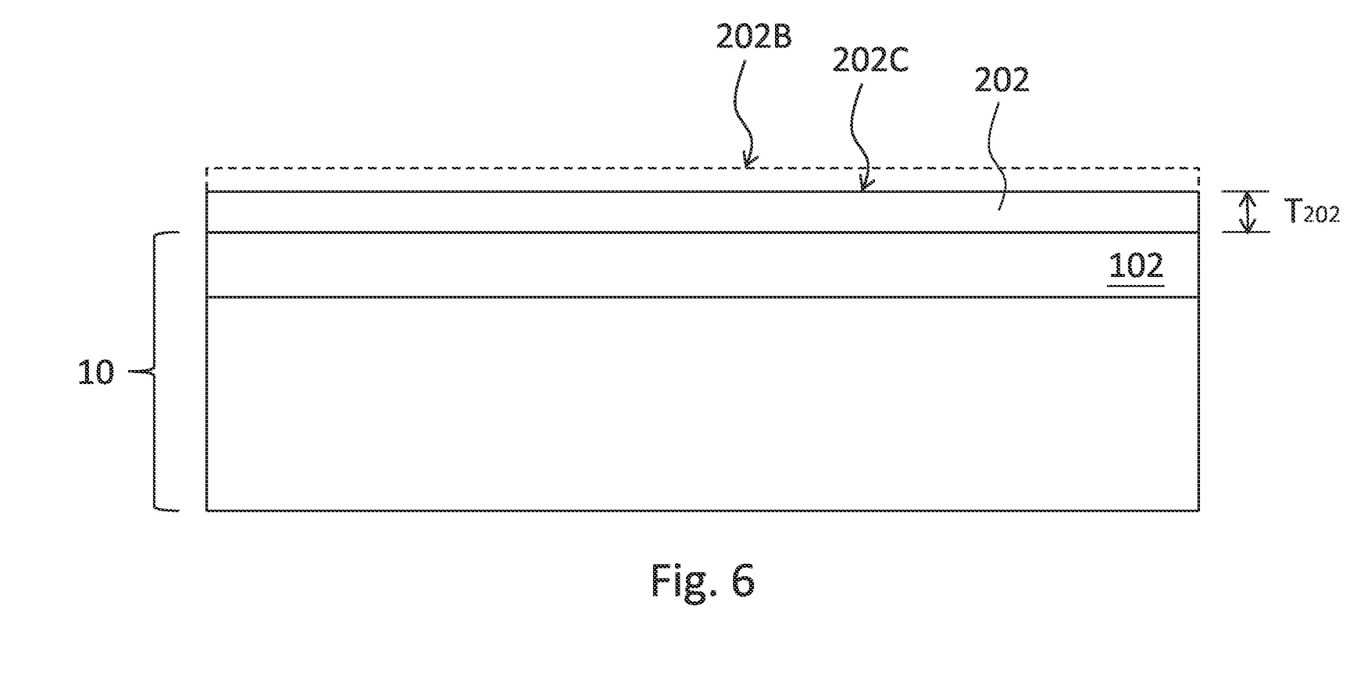
FIG. 6 illustrates a SOI substrate in accordance with some embodiments of the present disclosure.

In order to thin down the thickness of the silicon layer 202 in the SOI wafer, referring to FIG. 6, in some embodiments, after the germanium diffusion layer 203 is removed by HCl etching operation at the first temperature, the silicon layer 202 may be further thinned down to expose a third surface 202C. In some embodiments, the thickness $T_{202}$ of the silicon layer 202 after the thinning down process is about 85 nm. In some embodiments, the silicon layer 202 may be thinned down to a thickness less than about 50 nm for fully depleted transistors.

In some embodiments, the temperature in removing the germanium diffusion layer 203 may be increased. That is, in some embodiments, the germanium diffusion layer 203 or a portion thereof is removed by HCl etching operation at a third temperature. In some embodiments, the third temperature is in a range of from about 750 Celsius degrees to about 850 Celsius degrees. In some embodiments, the third temperature is higher than the first temperature, thus the etching rate in removing the germanium diffusion layer 203 is faster than the etching rate in removing the silicon germanium layer 204 as previously shown in FIG. 4.

In some embodiments, the third temperature may be maintained for thinning down the silicon layer 202 through HCl etching operation. That is, after the first surface 202A or the second surface 202B is exposed as previously shown in FIG. 4 or FIG. 5, in some embodiments, the silicon layer 202 may be thinned down to expose the third surface 202C through HCl etching operation at the third temperature. In other words, after the silicon germanium layer 204 is removed by HCl etching operation at the first temperature, the temperature in HCl etching may be increased to the third temperature to etch the germanium diffusion layer 203 and the remaining silicon layer 202 faster and more effective.

As foregoing mentioned, the silicon layer 202 may be baked at the fourth temperature after the HCl etching operation so that the second surface 202B may be smoothen. Likewise, in the case of the baking operation is implemented after the silicon layer 202 is further thinned down to expose the third surface 202C, the third surface 202C may be smoothen as well.

Figure 7:
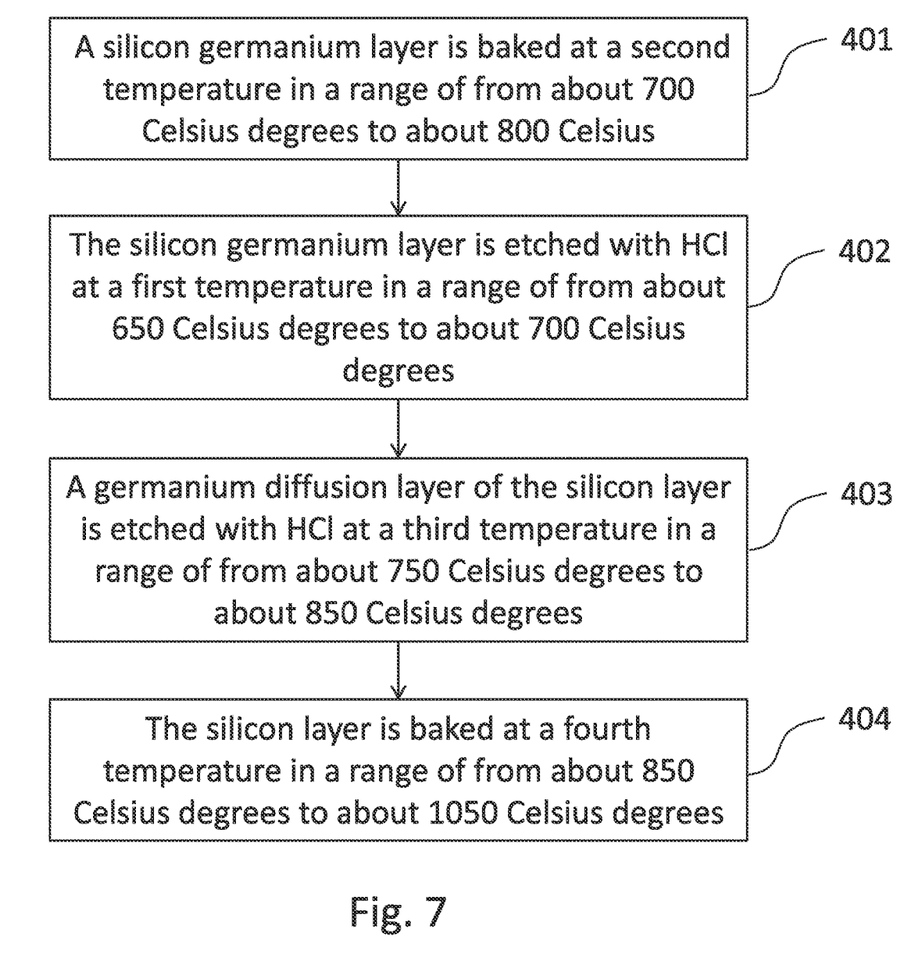
FIG. 7 illustrates a flow chart of a method for manufacturing a semiconductor wafer in accordance with some embodiments of the present disclosure.

Referring to FIG. 7, in some embodiments, the semiconductor wafer may be manufactured by a method includes at least two baking operations and two HCl etching operations. That is, in some embodiments, on the basis of a SOI substrate is provided and a silicon germanium layer thereof is exposed, the silicon germanium layer is started with being baked at a second temperature in a range of from about 700

Celsius degrees to about 800 Celsius degrees in an operation 401. Next, the silicon germanium layer is etched with HCl at a first temperature in a range of from about 650 Celsius degrees to about 700 Celsius degrees to expose a first surface of a silicon layer in an operation 402. In addition, a germanium diffusion layer of the silicon layer is etched with HCl at a third temperature in a range of from about 750 Celsius degrees to about 850 Celsius degrees to expose a second surface of the silicon layer in an operation 403. Finally, the silicon layer is baked at a fourth temperature in a range of from about 850 Celsius degrees to about 1050 Celsius degrees to smoothen a third surface of the silicon layer in an operation 404.

Through the manufacturing method disclosed in FIG. 7, the device substrate 20 as previously shown in FIG. 1 may be thinned down to a thin silicon layer with a thickness less than about 90 nm, depends on the purpose of SOI substrate and such thickness may be controlled through the etching time in the operation 403. Meanwhile, the third surface 202C of the silicon layer 202 is smoothed for depositing semiconductor devices thereon further. In some embodiments, by using atomic force microscopy (AFM) to measure the root mean square (RMS) roughness of the third surface 202C of the silicon layer 202, the RMS of the third surface 202C may be about 1.2 A only. Moreover, by using optical scan method (e.g., KLA) to detect silicon layer defects after the operation 404, the defect count on the third surface 202C of the silicon layer 202 may be performed as less than about 15 ea.

Figure 8:
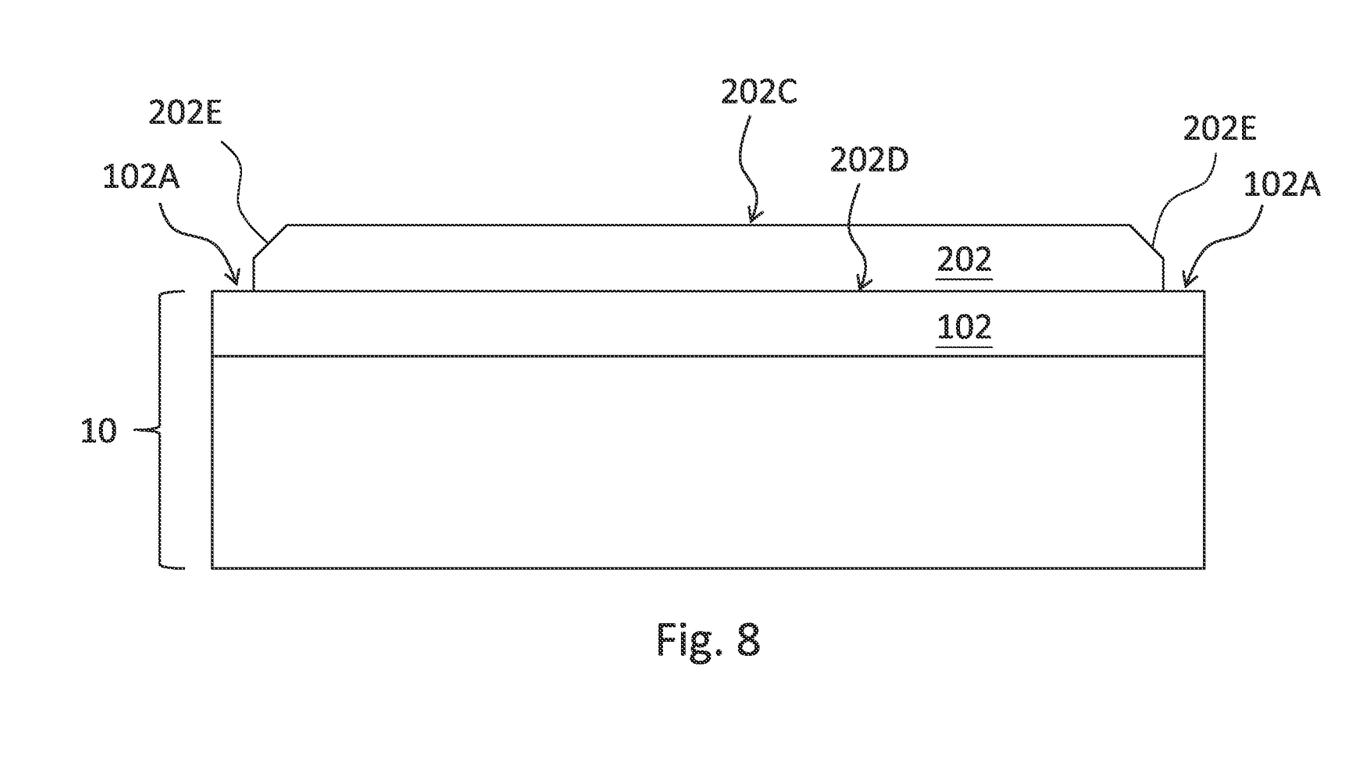
FIG. 8 illustrates cross-sectional views of a semiconductor wafer according to some embodiments of the present disclosure.

Referring to FIG. 8, a semiconductor wafer formed by the foregoing operations is disclosed. The semiconductor wafer is a SOI substrate which includes a handling substrate 10 and a silicon layer 202 thereon. The handling substrate 10 includes an insulating layer 102 in contact with a bottom surface 202D of the silicon layer 202. In some embodiments, the thickness of the silicon layer 202 is less than about 90 nm. In some embodiments, the boron concentration of the silicon layer is less than about $1E17/cm^3$. In some embodiments, total thickness variation (TTV) of the top surface (the third surface in foregoing operations) 202C of the silicon layer 202 is less than 10 nm.

In some embodiments, the insulating layer 102 is not fully covered by the silicon layer 202. In some embodiments, a peripheral portion 102A of the insulating layer 102 is exposed from the silicon layer 202. Generally, the size of the handling substrate is identical to the handling substrate; however, in some embodiments, the peripheral portion 102A of the insulating layer 102 is exposed because the edge portion of the device substrate is pruned off before bonding the device substrate on the handling substrate. In some embodiments, the width of the peripheral portion 102A may be in a range of from about 1 mm to about 2 mm.

In some embodiments, the silicon layer 202 over the handling substrate 10 has a crystalline structure at an edge of a top surface 202C of the silicon layer 202 which may be described by Miller indices including a value of {111}. Such {111} facet 202E is formed due to the anisotropy of silicon etching. That is, the anisotropy is likely due to etch kinetics differences when changing surface orientation, and etch rates are usually the lowest on {111} silicon planes.

In the present disclosure, the baking and HCl etching operations at high temperature (e.g. higher than 650 Celsius degrees) may be implemented in an epitaxy deposition tool. In some embodiments, the baking operations may be implemented with hydrogen gas and for removing the native oxides and smoothing the associated surfaces in the semiconductor wafer. In some embodiments, the HCl etching operations may be implemented to remove the silicon germanium layer and the germanium diffusion layer and thin down the handling substrate. Particularly, the etching defects may be decreased by the etch selectivity of silicon germanium to silicon under high temperature HCl etching, therefore the quality of semiconductor wafer may be ensured.

In one exemplary aspect, a method for manufacturing a semiconductor wafer is disclosed. The method includes the following operations. A semiconductor-on-insulator (SOI) substrate is provided. The SOI substrate has a handling substrate, a silicon layer over the handling substrate, and a silicon germanium layer over the silicon layer. The silicon germanium layer is etched at a first temperature with hydrochloric acid to expose a first surface of the silicon layer.

In another exemplary aspect, a method for manufacturing a semiconductor wafer is disclosed. A semiconductor-on-insulator (SOI) substrate is provided. The SOI substrate has a handling substrate and a device substrate bonded to the handling substrate at a bonding interface, the device substrate having a silicon layer and a silicon germanium layer stacked over the bonging interface. The portion of the device substrate is removed to expose the silicon germanium layer. The silicon germanium layer is etched with hydrochloric acid at a temperature over 650 Celsius degrees to expose a first surface of the silicon layer.

In yet another exemplary aspect, a semiconductor wafer structure is provided. The semiconductor wafer structure includes: a handling substrate and a silicon layer. The silicon layer is over the handling substrate and has a {111} facet at an edge of a top surface of the silicon layer. A defect count on the top surface of the silicon layer is less than about 15 ea.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor wafer, comprising:
    providing a semiconductor-on-insulator (SOI) substrate having a handling substrate and a device substrate bonded over the handling substrate, wherein the device substrate comprises a silicon layer over the handling substrate and a silicon germanium layer over the silicon layer, and wherein a top surface of the silicon germanium layer is exposed by etching a portion of the device substrate;
    baking the silicon germanium layer at a second temperature in a range of from about 700 Celsius degrees to about 800 Celsius degrees prior to etching the silicon germanium layer;
    etching the silicon germanium layer at a first temperature with hydrochloric acid to expose a first surface of the silicon layer, wherein the first surface of the silicon layer comprises a germanium diffusion layer;
    etching the germanium diffusion layer at a third temperature greater than the first temperature with hydrochloric acid to expose a second surface of the silicon layer; and baking the silicon layer at a fourth temperature after etching the germanium diffusion layer.

2. The method of claim 1, wherein the first temperature is in a range of from about 650 Celsius degrees to about 700 Celsius degrees.

3. The method of claim 1, wherein the silicon germanium layer has a germanium concentration in a range of from about 20% to about 30%.

4. The method of claim 1, wherein the fourth temperature is in a range of from about 850 Celsius degrees to about 1050 Celsius degrees.

5. The method of claim 1, further comprising:
etching the silicon layer from the second surface at the third temperature greater than the first temperature with hydrochloric acid to expose a third surface of the silicon layer.

6. The method of claim 1, wherein the third temperature is in a range of from about 750 Celsius degrees to about 850 Celsius degrees.

7. A method for manufacturing a semiconductor wafer, comprising:
providing a semiconductor-on-insulator (SOI) substrate having a handling substrate and a device substrate bonded to the handling substrate at a bonding interface, the device substrate having a silicon layer and a silicon germanium layer stacked over the bonding interface;
etching a portion of the device substrate to expose the silicon germanium layer;
baking the silicon germanium layer at a second temperature in a range of from about 700 Celsius degrees to about 800 Celsius degrees prior to etching the silicon germanium layer;
etching the silicon germanium layer with hydrochloric acid at a first temperature in a range of from about 650 Celsius degrees to about 700 Celsius degrees to expose a first surface of the silicon layer; and
etching a germanium diffusion layer of the silicon layer with hydrochloric acid at a third temperature in a range of from about 750 Celsius degrees to about 850 Celsius degrees to expose a second surface of the silicon layer.

8. The method of claim 7, wherein a thickness of the silicon germanium layer is less than about 15 nm.

9. The method of claim 7, wherein the second surface of the silicon layer comprises a {111} facet at an edge of the silicon layer.

10. The method of claim 7, wherein a width of the silicon layer is narrower than a width of the handling substrate.

11. The method of claim 7, further comprising:
thinning down the silicon layer to expose a third surface of the silicon layer after etching the germanium diffusion layer.

12. The method of claim 11, wherein a thickness of the silicon layer after thinning down the silicon layer is about 85 nm.

13. The method of claim 11, wherein a thickness of the silicon layer after thinning down the silicon layer is less than about 50 nm.

14. A method for manufacturing a semiconductor wafer, comprising:
etching a device substrate to expose a silicon germanium layer of the device substrate, wherein the device substrate is bonded to a handling substrate at a bonding interface;
baking the silicon germanium layer at a second temperature in a range of from about 700 Celsius degrees to about 800 Celsius degrees prior to etching the silicon germanium layer;
etching the silicon germanium layer at a first temperature with hydrochloric acid;
etching a germanium diffusion layer below the silicon germanium layer at a third temperature with hydrochloric acid, wherein the third temperature is higher than the first temperature; and
baking a silicon layer below the germanium diffusion layer at a fourth temperature;
wherein the fourth temperature is in a range of from about 850 Celsius degrees to about 1050 Celsius degrees;
wherein the second temperature is higher than the first temperature.

15. The method of claim 14, wherein a thickness of the silicon germanium layer prior to being etched is less than about 15 nm.

16. The method of claim 14, wherein the silicon germanium layer is baked with hydrogen gas and at a pressure less than about 100 torr.

17. The method of claim 14, wherein the operation of etching the device substrate to expose the silicon germanium layer of the device substrate comprises etching the device substrate through wet etching.

18. The method of claim 17, further comprising:
polishing the device substrate subsequent to etching the device substrate.

19. The method of claim 14, wherein a baking time in baking the silicon germanium layer at the second temperature is in a range of from about 1 minute to about 2 minutes.

* * * * *